United States Patent [19]

You

[11] Patent Number: 5,751,043
[45] Date of Patent: May 12, 1998

[54] SRAM WITH SIPOS RESISTOR

[75] Inventor: Chue-San You, Hsin-Chu, Taiwan

[73] Assignee: Taiwan Semiconductor Manufacturing Company, Ltd., Hsin-Chu, Taiwan

[21] Appl. No.: 823,572

[22] Filed: Mar. 25, 1997

Related U.S. Application Data

[60] Continuation of Ser. No. 518,704, Aug. 24, 1995, abandoned, which is a division of Ser. No. 280,219, Jul. 25, 1994, Pat. No. 5,470,779.

[51] Int. Cl.⁶ .................................................. H01L 27/11
[52] U.S. Cl. ......................... 257/380; 257/537; 257/538; 257/646; 257/904
[58] Field of Search .............................. 257/904, 903, 257/537, 538, 380, 646

[56] References Cited

U.S. PATENT DOCUMENTS

| | | | |
|---|---|---|---|
| 4,176,372 | 11/1979 | Matsushita et al. | 257/636 |
| 4,533,935 | 8/1985 | Mochizuki | 257/538 |
| 4,717,681 | 1/1988 | Curran | 437/31 |
| 4,950,620 | 8/1990 | Harrington, III | 437/60 |
| 4,961,103 | 10/1990 | Saitoh et al. | 257/380 |
| 4,965,214 | 10/1990 | Choi et al. | 437/24 |
| 5,200,356 | 4/1993 | Tanaka | 437/60 |
| 5,616,951 | 4/1997 | Liang | 257/537 |

OTHER PUBLICATIONS

Sze, "VLSI Technology" McGraw Hill International Editions p. 248.

Primary Examiner—Tom Thomas
Assistant Examiner—David B. Hardy
Attorney, Agent, or Firm—George O. Saile; Stephen B. Ackerman; Graham S. Jones, II

[57] ABSTRACT

A method of manufacture of a semiconductor device on a semiconductor substrate including an SRAM cell with a resistor comprises formation of a polysilicon 1 layer on said semiconductor substrate. The polysilicon 1 layer is patterned and etched. An interpolysilicon layer is formed over the polysilicon 1 layer, patterned and etched forming an opening through the interpolysilicon layer exposing a contact area on the surface of the polysilicon 1 layer. A SIPOS layer forms a resistor material over the interpolysilicon layer in contact with the polysilicon 1 layer through the opening. A load resistor mask is formed over a load resistor region to be formed in the SIPOS layer, and ions are implanted in the remainder of the SIPOS layer not covered by the load resistor mask to convert the remainder of the SIPOS layer from a resistor into an interconnect structure integral with a load resistor in the load resistor region.

12 Claims, 7 Drawing Sheets

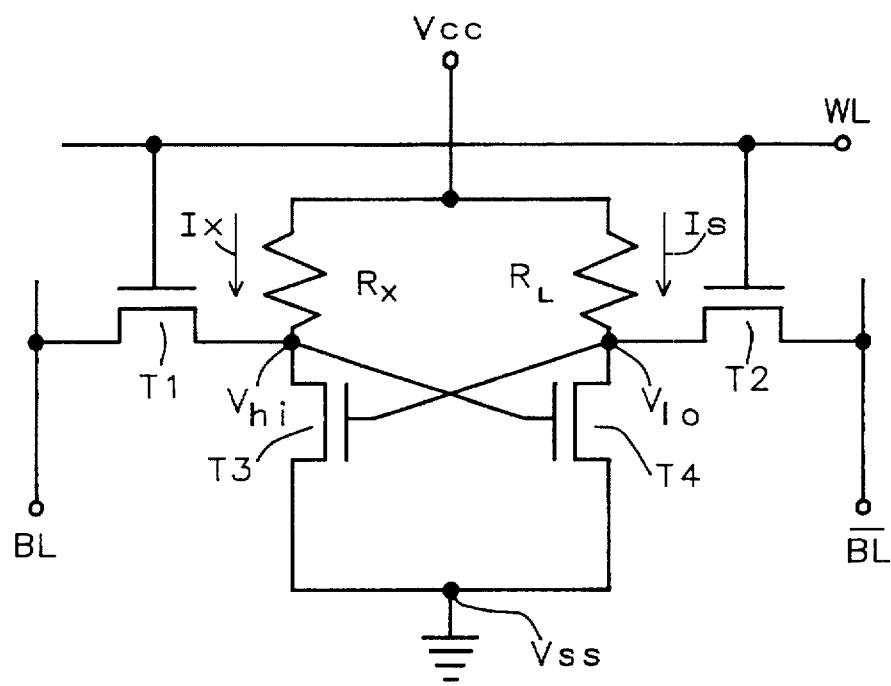
FIG. 1
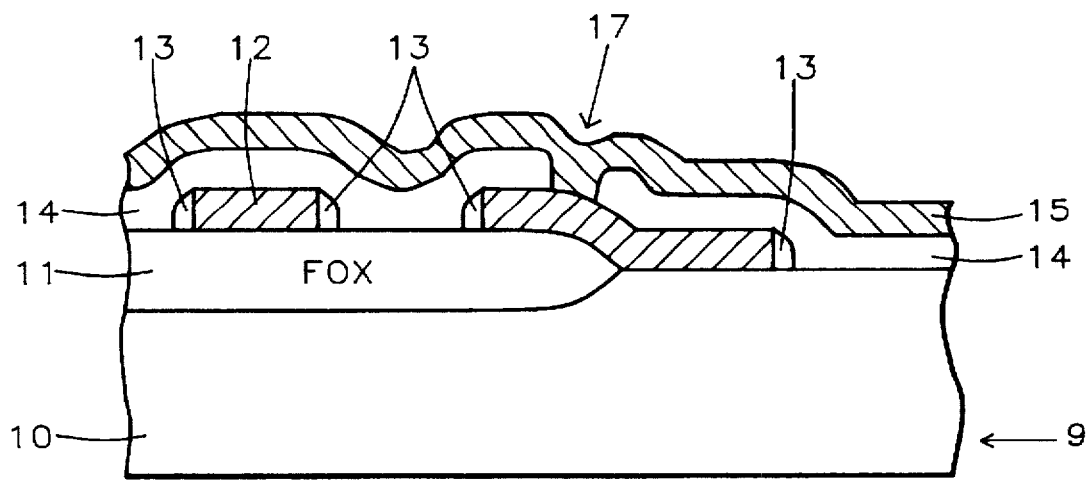
FIG. 2 - Prior Art

5,751,043

SRAM WITH SIPOS RESISTOR

This application is a continuation of application Ser. No. 08/518,704 filed on Aug. 24, 1995, now abandoned which is a division of application Ser. No. 08/280,219 filed on Jul. 25, 1994 which is now U.S. Pat. No. 5,470,779.

BACKGROUND OF THE INVENTION

1. Field of the Invention

This invention relates to SRAM memory devices and more particularly to improved load resistors therefor.

2. Description of Related Art

U.S. Pat. No. 5,200,356 of Tanaka for "Method of Forming a Static Random Access Memory Device" and U.S. Pat. No. 4,950,620 of Harrington for "Process for Making Integrated Circuit with Doped Silicon Dioxide Load Elements" show SRAM devices with load resistors formed by ion implantation of impurities in a silicon dioxide film.

U.S. Pat. No. 4,717,681 of Curran for "Method of Making a Heterojunction Bipolar Transistor with SIPOS" shows a method for manufacturing a semiconductor device which uses a Semi-Insulating Polycrystalline Silicon (SIPOS) as described at Col. 6, lines 50–63, etc. where Curran states that SIPOS films are deposited conventionally at low temperatures (620° C.) by LPCVD (low pressure chemical vapor deposition, of silane and nitrous oxide. The films may be deposited either doped or undoped, by in-situ inclusion of a doping gas such as phosphine. Alternatively, SIPOS films can be fabricated by molecular beam deposition with simultaneous electron beam evaporation of silicon and ion implantation of oxygen and ion implantation of dopants, such as phosphorous, if desired. The dopants can be electrically activated by means of rapid thermal annealing (RTA).

Sze "VLSI Technology" page 248 "The addition of oxygen to polysilicon increases the film resistivity. The resulting material, semi-insulating polysilicon (SIPOS), is used as a passivating coating for high voltage devices . . . . SIPOS is deposited when silane reacts with small amounts of nitrous oxide at temperatures between 600° and 700° C. The two simultaneous reactions are

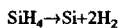
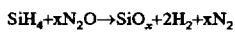

$$SiH_4 \rightarrow Si + 2H_2$$

$$SiH_4 + xN_2O \rightarrow SiO_x + 2H_2 + xN_2$$

The quantity of nitrous oxide in the reaction determines the film composition and resistivity . . . . SIPOS has a multiphase microstructure containing crystalline silicon, amorphous silicon and silicon monoxide. The specific composition depends on the deposition temperature, the amount of nitrous oxide used in the reaction, and the time and temperature of post-deposition anneals. SIPOS used in VLSI circuits contains between 25 at. % (atomic percent) and 40 at. % oxygen.

FIG. 2 is a sectional view of a fragment of a prior art SRAM (Static Random Access Memory) device 9 with a substrate 10 composed of silicon. The device includes a FOX (field oxide) region 11 upon which a polysilicon 1 gates 12 and 16 are formed with silicon dioxide spacers 13 on either side. Polysilicon 1 gate 16 extends across the edge of the FOX region 11 in direct contact with the surface of the silicon substrate 10. Above that structure is formed a dielectric layer 14 (comprising an interpolysilicon (IPO) structure) composed tropically of $SiO_2$ with an opening 17 therethrough above the gate 16. Next, a blanket layer 15 of undoped polysilicon 2 resistor material is formed over the preceding layers. Layer 15 in stacked contact through opening 17 with polysilicon 1 gate 16.

Prior art polysilicon ion implanted resistors have had a length of about 2.6 μm with a width of about 0.4 μm to about 0.6 μm.

The problem with conventional polysilicon load resistors is that they suffer large resistance variations and high temperature coefficients.

SUMMARY OF THE INVENTION

In accordance with this invention, a method of manufacture of a semiconductor device on a semiconductor substrate including an SRAM cell with a resistor comprises formation of a polysilicon 1 layer on said semiconductor substrate, patterning and etching the polysilicon 1 layer, formation of an interpolysilicon layer over the polysilicon 1 layer, patterning and etching an opening through the interpolysilicon layer exposing a contact area on the surface of the polysilicon 1 layer, forming a SIPOS layer comprising a resistor material over the interpolysilicon layer in contact with the polysilicon 1 layer through the opening, and formation of a load resistor mask over a load resistor region to be formed in the SIPOS layer, and ion implanting the remainder of the SIPOS layer not covered by the load resistor mask to convert the remainder of the SIPOS layer from a resistor into an interconnect structure integral with a load resistor in the load resistor region.

Preferably, the SIPOS layer is processed into an interconnect structure by ion implantation with a dose of arsenic or phosphorous ions implanted within the range from about $8 \times 10^{13}/cm^2$ to about $9 \times 10^{13}/cm^2$ at from about 30 keV to about 50 keV.

Preferably, the resistor and interconnect are formed from SIPOS originally having a composition of 30% oxygen.

Preferably, the SIPOS is formed by the process of LPCVD.

Preferably, the SIPOS is formed from $SiH_4$ plus $N_2O$ in a LPCVD deposition process.

Preferably, the SIPOS is formed by the process of CVD, or plasma CVD at a temperature within the range 620° C. to 800° C. in an LPCVD, APCVD, or plasma CVD chamber.

Preferably, an IPO layer is formed over the SIPOS layer subsequent to the ion implantation.

Preferably, the IPO layer is densified by the process of CVD, or plasma CVD at a temperature within the range 800° C. to 900° C. in a furnace or CVD chamber.

Preferably, an IPO layer is formed over the SIPOS layer subsequent to the ion implantation.

Preferably, the IPO layer is densified by the process of plasma etching at a temperature within the range 300° C. to 500° C. in a plasma chamber.

Preferably, the SIPOS layer is processed into an interconnect structure by ion implantation with a dose of arsenic or phosphorous ions implanted within the range from about $6 \times 10^{13}/cm^2$ to about $1 \times 10^{14}/cm^2$ at from about 20 keV to about 60 keV.

Preferably, the resistor is formed from SIPOS having a composition of 10% to about 45% oxygen.

3

Preferably, the SIPOS is formed by the process of LPCVD.

Preferably, the SIPOS is formed from $SiH_4$ plus $N_2O$ in a LPCVD deposition process.

In accordance with another aspect of this invention, a semiconductor device on a semiconductor substrate including an SRAM cell with a resistor comprises:

a patterned and etched polysilicon 1 layer on the semiconductor substrate, an interpolysilicon layer over the polysilicon 1 layer patterned with an opening through the interpolysilicon layer to a contact area on the surface of the polysilicon 1 layer, a SIPOS layer comprising a resistor material over the interpolysilicon layer in contact with the polysilicon 1 layer through the opening, and the SIPOS layer including a load resistor region over the contact area load resistor region, and the remainder of the SIPOS layer comprising an interconnect structure integral with the load resistor region.

Preferably, the resistor is formed from SIPOS having a composition of 10% to about 45% of oxygen.

Preferably, the SIPOS was formed by the process of LPCVD.

Preferably, the SIPOS was formed from $SiH_4$ plus $N_2O$ in a LPCVD deposition process.

Preferably, the SIPOS is formed by the process of LPCVD or plasma CVD at a temperature within the range 620° C. to 800° C. in a LPCVD or plasma CVD chamber.

Preferably, the interconnect portion of the SIPOS layer was ion implanted with a dose of phosphorus ions implanted within the range from about $1 \times 10^{14}/cm^2$ to about $9 \times 10^{15}/cm^2$ at from about 20 keV to about 40 keV.

BRIEF DESCRIPTION OF THE DRAWINGS

The foregoing and other aspects and advantages of this invention are explained and described below with reference to the accompanying drawings, in which:

FIG. 1 shows a four MOS transistor (4T) SRAM (Static Random Access Memory) cell comprising two cross-coupled transistors including pass (transfer) transistors and driver transistors.

FIG. 2 is a sectional view of a fragment of a prior art SRAM (Static Random Access Memory) device with a substrate composed of silicon.

FIG. 3 shows the results of the preliminary set of steps of manufacture of a device formed on silicon semiconductor substrate.

FIG. 4 shows the device of FIG. 3 after an initial blanket polysilicon 1 layer has been applied over the substrate by a conventional process to be patterned to form polysilicon 1 structures.

FIG. 5 shows the device 19 of FIG. 4 after a blanket CVD deposit of a spacer silicon dioxide layer 23.

FIG. 6 shows the device 19 of FIG. 5 following several steps including a spacer etchback leaving silicon dioxide spacers on the ends of polysilicon 1 gate structures and formation of an interpolysilicon layer and a mask and using he mask for etching an opening in the interpolysilicon layer.

FIG. 7 shows the device of FIG. 6 is shown after the mask has been removed.

FIG. 8 shows the device which is the product of FIG. 6 after a combined interconnect and load resistor SIPOS layer is applied.

4

Figure 8:
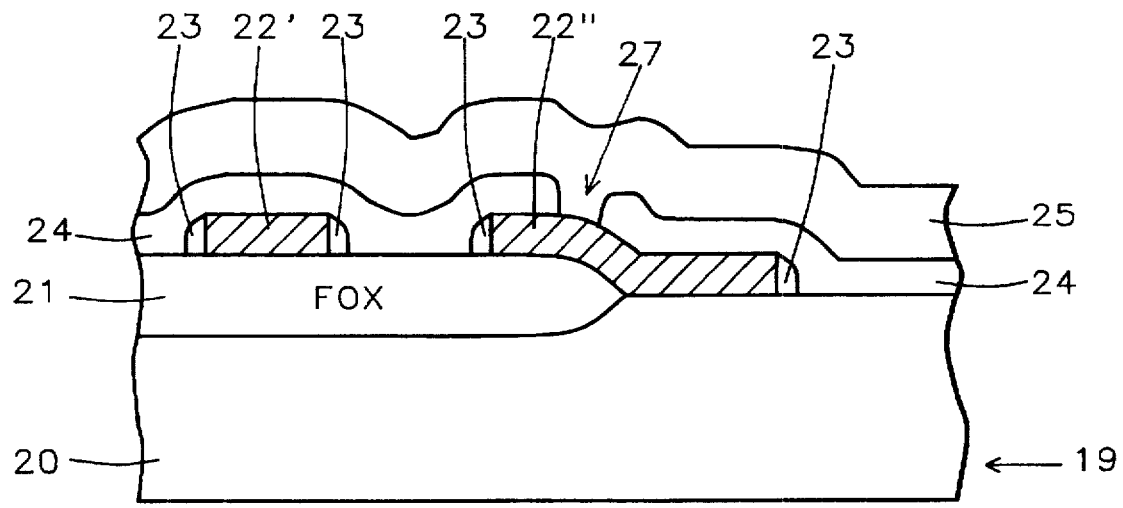
Figure 9:
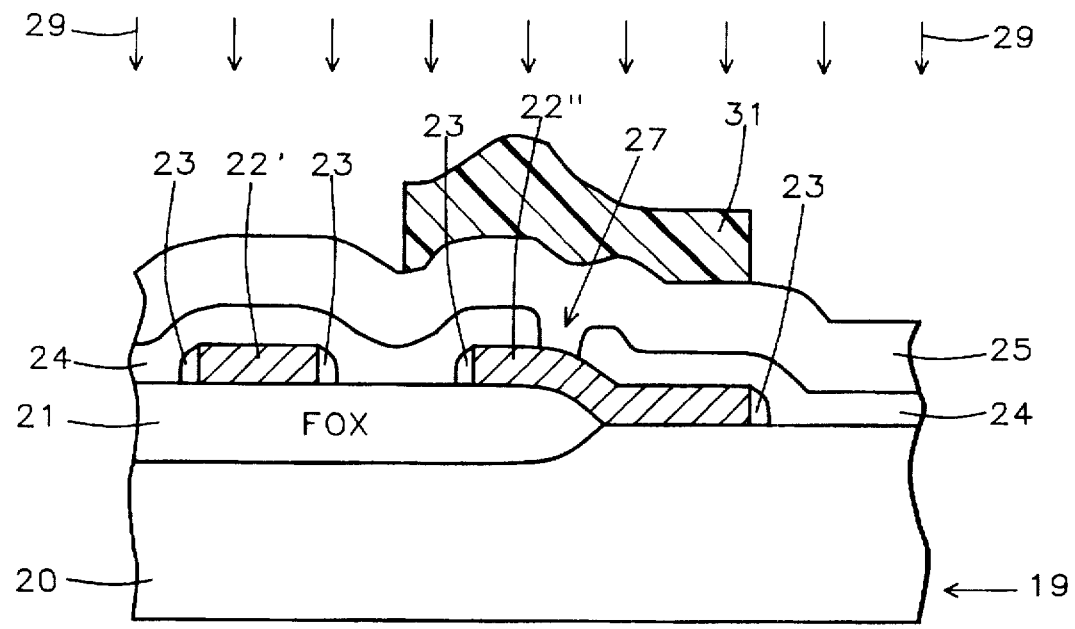

FIG. 9 shows the device of FIG. 8 with a blanket interconnect layer masked generally above the opening in the interpolysilicon layer and on either side thereof with a resistor mask provided to protect the load resistor region.

Figure 10:
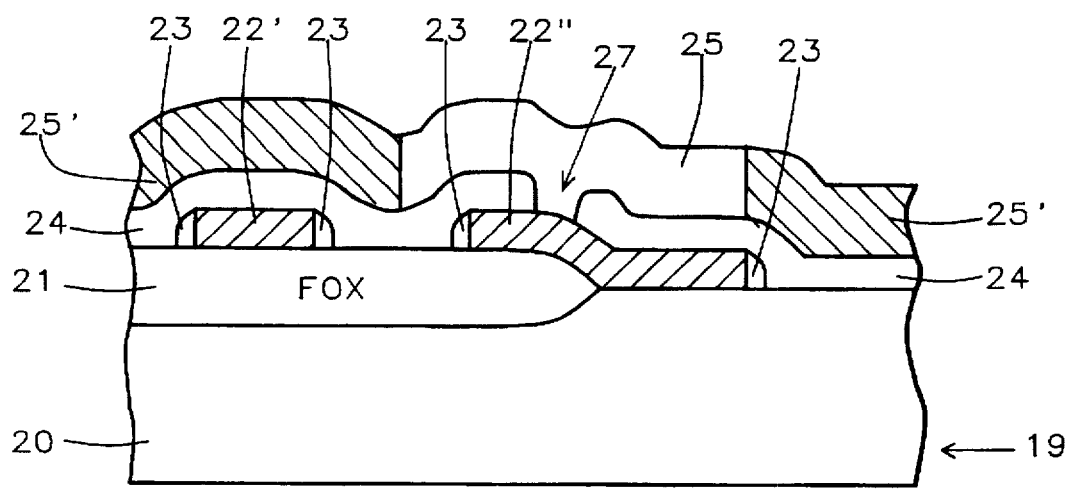

FIG. 10 shows the product of the process of FIG. 9.

Figure 11:
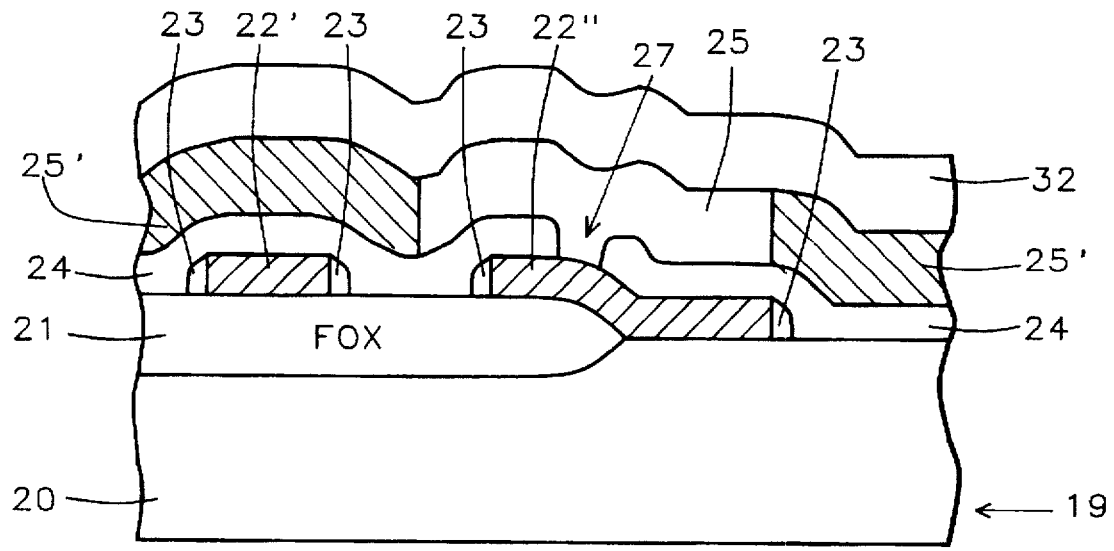

FIG. 11 shows the device of FIG. 10 covered with a blanket silicon dioxide (IPO) type dielectric layer, preferably BPSG, having a thickness of from about 5000 Å to about 10,000 Å, and it is preferably composed of $SiO_2$ but it can also be composed of PSG or BPSG.

Figure 12:
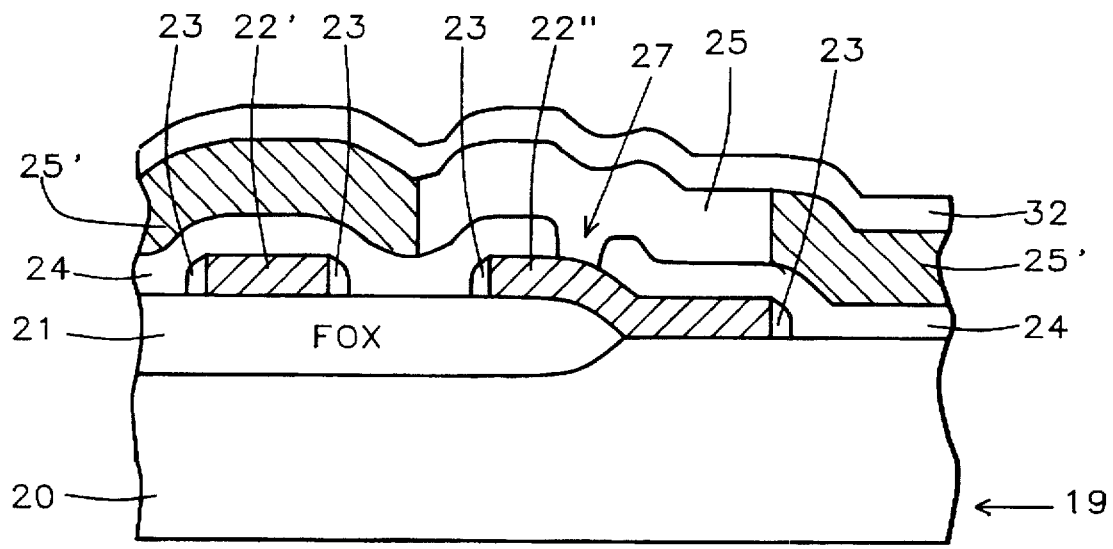

FIG. 12 shows the device of FIG. 11 after the BPSG layer has been densified by the process of annealing in a furnace.

Figure 13:
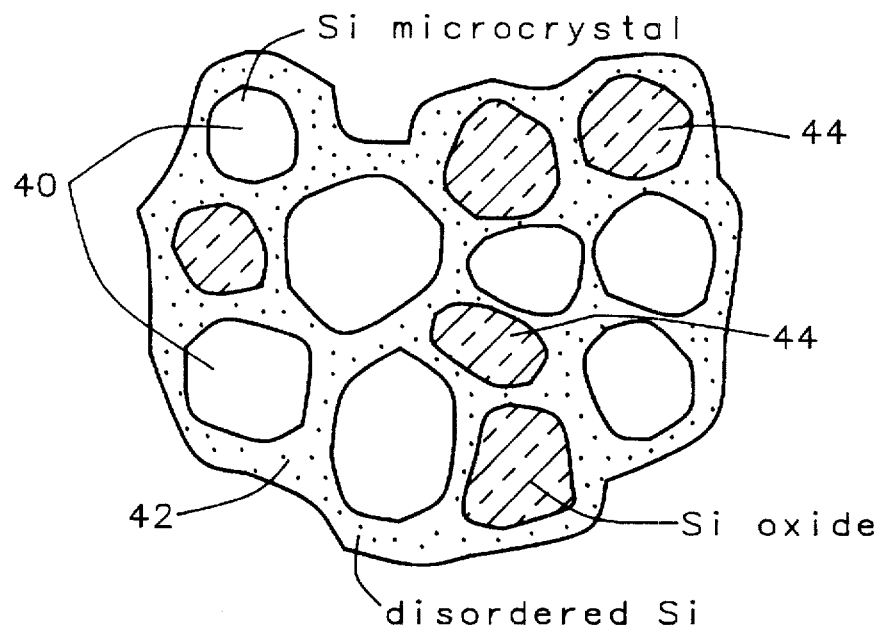

FIG. 13 is a drawing of a typical SIPOS $SiO_x$, where x can be altered by changing the gas ratio of ($SiH_4/N_2O$).

Figure 4:
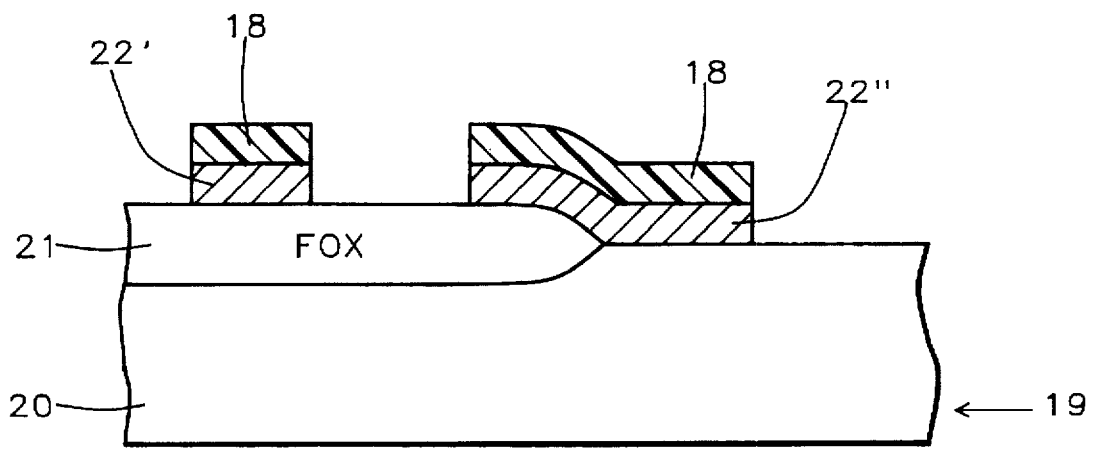

FIG. 4 is a graph of resistivity vs oxygen concentration for SIPOS films.

DESCRIPTION OF THE PREFERRED EMBODIMENT

FIG. 1 shows a four MOS transistor (4T) SRAM (Static Random Access Memory) cell comprising two cross-coupled transistors including pass (transfer) transistors T1 and T2 and driver transistors T3 and T4.

Driver transistors T3 and T4 have their drains connected respectively to nodes $V_{hi}$ and $V_{lo}$ and their gates connected respectively to nodes $V_{lo}$ and $V_{hi}$. Pass transistors T1 and T2 have their gates connected to word line WL. In addition, the SRAM cell of FIG. 1 includes two resistors, load resistor $R_L$ connected between terminal $V_{cc}$ and node $V_{lo}$ which is connected to the S/D circuit of transistor T4, resistor $R_x$ connected between terminal $V_{cc}$ and node $V_{hi}$ which is connected to the S/D circuit of transistor T3. The other ends of the S/D circuits of transistors T3 and T4 are connected to $V_{ss}$ (ground level.)

Pass transistor T1 and pass transistor T2 have their gates connected to word line WL and their S/D circuits respectively connected between node $V_{hi}$ and bit line BL for transistor T1 and node $V_{lo}$ and bit line BL-bar for transistor T2. The drain of pass transistor T1 is connected to node $V_{hi}$. The drain of pass transistor T2 is connected to node $V_{lo}$. The current $I_s$ flows from terminal $V_{cc}$ through load resistor $R_L$ to node $V_{lo}$. The current $I_x$ flows from terminal $V_{cc}$ through load resistor $R_x$ to node $V_{hi}$.

When the word line WL is driven high, pass transistors T1 and T2 are turned on. As a result, the one of the driver transistors T3 and T4 currently on (depending upon data stored in the cell) will sink current through pass transistor T1 or T2 from the bit line BL or BL-bar, which initiates a change in the voltage on that bit line. A sense amplifier can sense the changing voltage differential across the bit line pair and provide an corresponding digital output. In the write mode, a desired data signal is sent from the bit lines to the pass transistors T1 and T2 turning them on to reset the driver transistors T3 and T4.

The resistance of a resistor structure is defined by the equation as follows:

$$R = rho \frac{L}{A}$$

where rho=resistivity

L=length

A=cross sectional area.

In order to have a high load resistance, the load resistor can be increased in value by increasing its length L or by decreasing its cross sectional area A. It is difficult to decrease the thickness or the width of the thin film resistors below a predetermined amount. There is also a limit on how narrow the load resistor can be made or how long it can be made. With combined polysilicon over SIPOS a shorter polysilicon load is needed. What is helpful is a higher value of the resistivity, rho than has been used heretofore and an ability to obtain a value of rho which is desired.

FIGS. 3–8 illustrate a preferred process of making a device in accordance with this invention.

Figure 3:
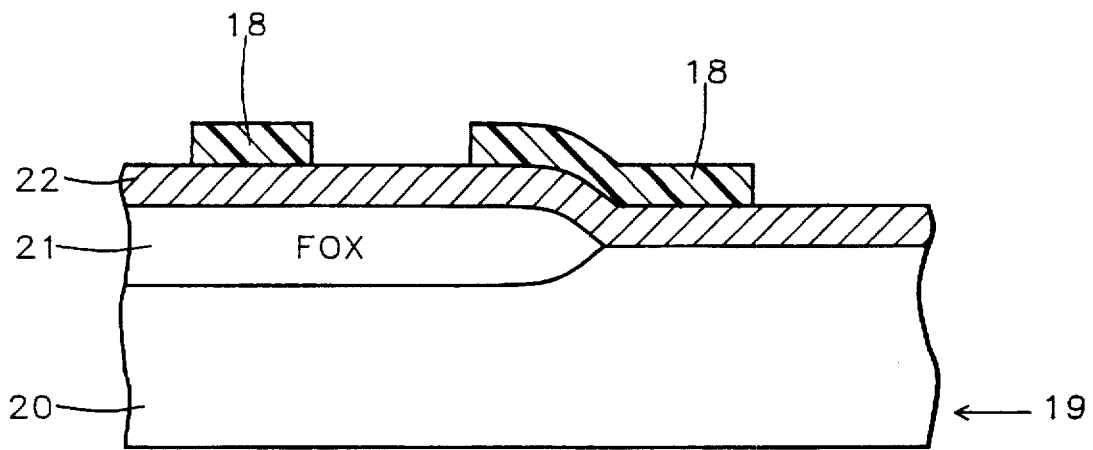
FIGS. 3–8 illustrate a preferred process of making a device in accordance with this invention.

FIG. 3 shows the results of the preliminary set of steps of manufacture of a device 19 formed on silicon semiconductor substrate 20. Initially a blanket polysilicon 1 layer has been applied over the substrate 20 by a conventional process to be patterned to form polysilicon 1 structures 22', 22" as shown in FIG. 4.

A blanket photoresist layer 18 was deposited over the polysilicon 1 layer. Then photoresist layer 18 was formed into photoresist mask 18 over the device 19 by process steps including patterning by a conventional photolithographic process into the shape of polysilicon 1 structures 22' and 22" to be produced. Then with the mask 18 in place, the polysilicon 1 layer 22 is etched through the mask to produce the polysilicon structures 22' and 22".

Figure 5:
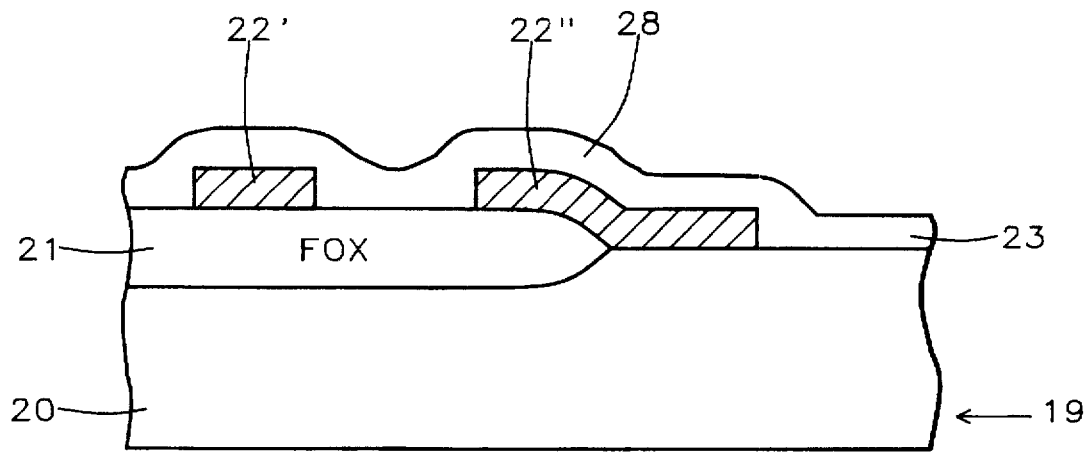

FIG. 5 shows the device 19 of FIG. 4 after a blanket CVD deposit of a spacer silicon dioxide layer 23.

Figure 6:
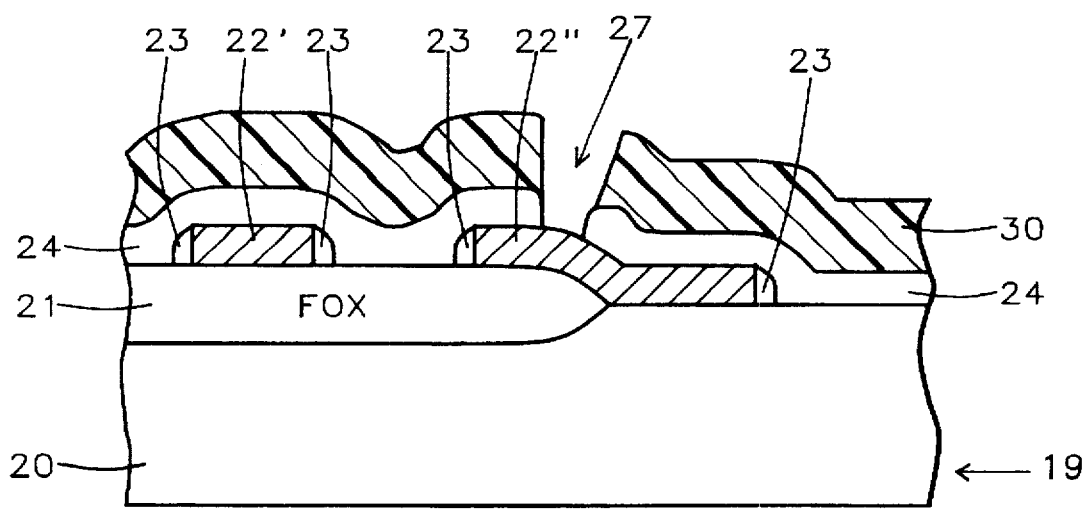

FIG. 6 shows the device 19 of FIG. 5 following several steps including a spacer etchback leaving the silicon dioxide spacers 23 on the ends of polysilicon 1 gate structures 22' and 22".

Then an interpolysilicon structure 24 is formed above the gate structures 22', 22" and spacers 23 and the exposed FOX region 21 and substrate 20. Interpolysilicon (silicon dioxide or SIPOS) structure 24 which preferably has a thickness of from about 300 Å to about 2000 Å, is preferably composed of SIPOS. Interpolysilicon structure 24 can be formed by a process of LPCVD, or plasma CVD at a temperature within the range 400° C. to 800° C.

Next, a photoresist layer 30 is formed over interpolysilicon structure 24 and patterned into a mask photoresist layer 30 photolithographically to provide an opening 27 therein above interpolysilicon silicon dioxide structure 24 and, of course, above the polysilicon 1 gate 22", as well.

Using opening 27 in photoresist mask 30, the opening 27 is also etched through interpolysilicon silicon dioxide or SIPOS structure 24. The interpolysilicon silicon dioxide or SIPOS structure 24 is etched by means of plasma etching. Then the photoresist mask 30 is removed.

Figure 7:
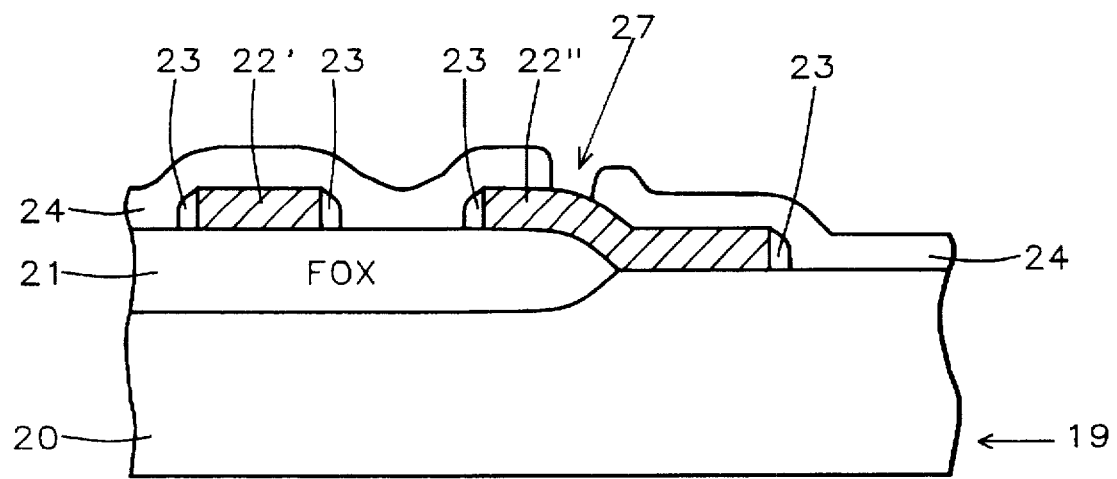

Then referring to FIG. 7, the device 19, which is the product of FIG. 6 is shown after the mask 30 has been removed.

Then referring to FIG. 8, the device 19, which is the product of FIG. 6 is shown after a combined interconnect and load resistor SIPOS layer 25 is applied having a thickness of from about 300 Å to about 800 Å.

The SIPOS layer 25 can be formed by a process performed using $SiH_4$ plus $N_2O$ forming a composition of polysilicon and oxygen with from 10% to 45% oxygen in the polysilicon. The SIPOS process is performed at a temperature within the range 620° C. to 800° C. in a LPCVD or plasma CVD chamber.

Subsequently, as shown in FIG. 9 the device 19 of FIG. 8 is shown with blanket interconnect layer 25 masked generally above area 27 and on either side thereof with a resistor mask 31 provided to protect the load resistor region. The portion of interconnect layer 25 remaining exposed is then heavily doped by ion implantation with phosphorus or arsenic 29. The dose of the ions 29 implanted is within the range from about $1\times10^{14}/cm^2$ to about $9\times10^{15}/cm^2$ at an energy level from about 20 keV to about 40 keV converting portions of the interconnect layer 25 into conductor layers 25' while the remainder of the layer 25 near opening 27 remains a material with relatively high resistivity suitable for a load resistor.

FIG. 10 shows the product of the process of FIG. 9.

Later the interconnect layer 25, 25' is patterned by use of a mask and etching in accordance with the techniques employed above.

Subsequently, as shown in FIG. 11 the device 19 of FIG. 10 is shown covered with blanket silicon dioxide (IPO) type dielectric layer 32, preferably BPSG, having a thickness of from about 5000 Å to about 10,000 Å, and it is preferably composed of $SiO_2$ but it can also be composed of PSG or BPSG.

FIG. 12 shows the device 19 of FIG. 11 after the BPSG layer 32 has been densified by the process of annealing in a furnace at a temperature within the range 800° C. to 900° C. in a furnace or a plasma chamber.

The greater the percentage of oxygen ($O_2$) in the SIPOS layer 25, 25', the easier it is to control a thicker resistor.

Ion implantation makes it possible to control resistivity of the load resistor 25. The more dopants such as As or P introduced to load resistor 25, the lower the SIPOS resistance.

The Vcc implant is then implemented with phosphorus with a dosage in the range from $1\times10^{14}/cm^2$ to about $9\times10^{15}/cm^2$ with an energy range from about 20 keV to about 40 keV; the purpose being to lower the polysilicon interconnect resistance.

FIG. 13 is a drawing of a typical SIPOS $SiO_x$, where x can be altered by changing the gas ratio of $(SiH_4/N_2O)$. The drawing shown is FIG. 13 is derived from M. Hamasaki et al American Inst. of Phys 49(7) (July, 1978). The SIPOS includes silicon microcrystal regions 40, an overall disordered Si region 42 and silicon oxide regions 44.

Figure 14:
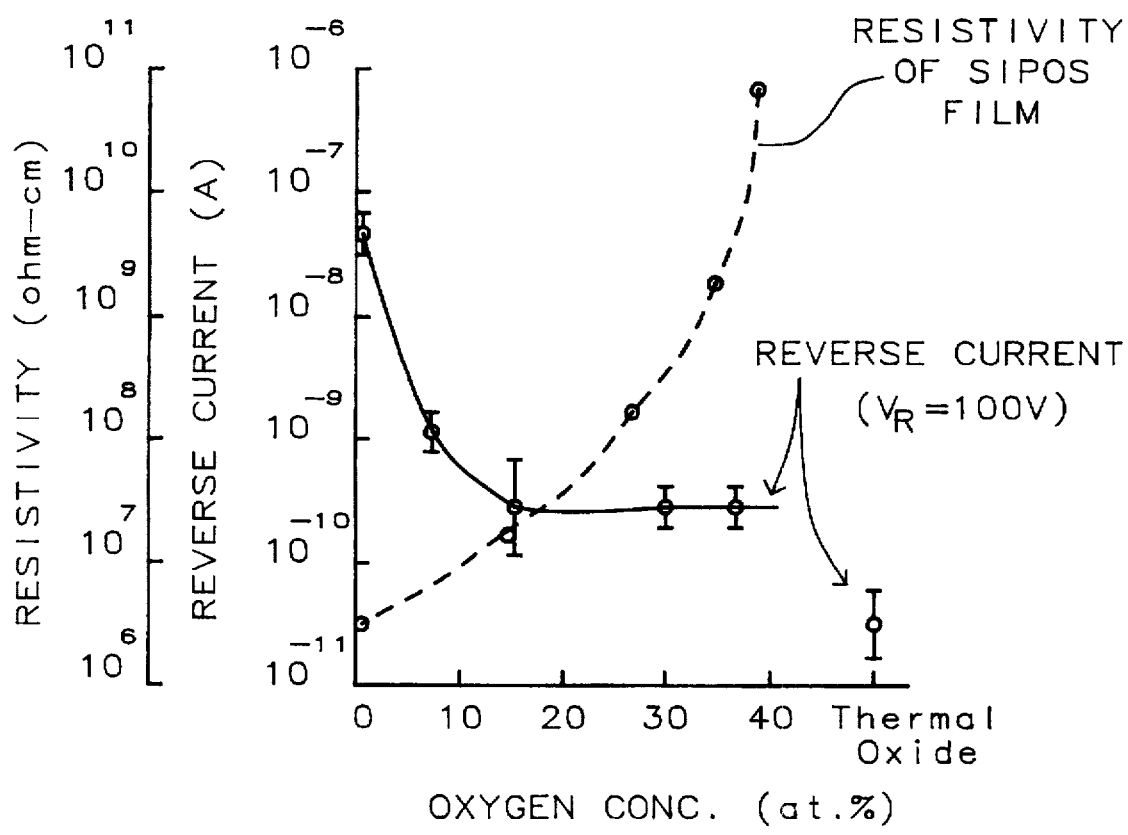

FIG. 14 is a graph of resistivity vs oxygen concentration for SIPOS films. The resistivity can be tuned by changing the x value of $SiO_x$. The value of x is within the range from about 40% to about 50%. Preferably, the value of x is about 1.4. The graph shows reversed leakage currents of p+—n diodes passivated with SIPOS films as a function of oxygen concentration in SIPOS films as compared with that of p+—n planar diode, and resistivities of SIPOS films as a function of oxygen concentration. FIG. 14 is derived from Matsushita et al, IEEE, Trans. on E.D. Vol. ED-23, No. 8, (August 1976).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A semiconductor device on a semiconductor substrate including an SRAM cell with a resistor comprising:
   a patterned and etched first polysilicon layer on said semiconductor substrate,
   an undoped interpolysilicon layer formed over said first polysilicon layer patterned with an opening through said undoped interpolysilicon layer to a contact area on the surface of said first polysilicon layer, a Semi-Insulating POlycrystalline Silicon, referred to hereinafter as SIPOS, layer formed over the top surface of said undoped interpolysilicon layer, said SIPOS layer comprising a main undoped SIPOS load resistor region and a doped remainder SIPOS region, said undoped load resistor region extending down through said opening through said undoped interpolysilicon layer to said contact area on the surface of said first polysilicon layer in contact with said first polysilicon layer through said opening, and said undoped load resistor region extending over said undoped interpolysilicon layer to said doped SIPOS region of said SIPOS layer, said doped remainder of said SIPOS layer comprising said doped SIPOS region comprising an interconnect conductor structure integral with said load resistor region, said doped SIPOS having been doped with ions providing a lower resistance of said remainder of said SIPOS layer than said load resistor region, said conductor structure overlying said undoped interpolysilicon layer, and a dielectric layer formed over said SIPOS layer.

2. The semiconductor device of claim 1 wherein said interconnect portion of said SIPOS layer was ion implanted with ions selected from the group consisting of phosphorus or arsenic ions implanted with a dose within the range from about $6 \times 10^{13}/cm^2$ to about $9 \times 10^{15}/cm^2$.

3. The semiconductor device of claim 1 wherein said SIPOS layer has a thickness from about 300 Å to about 800 Å and has a composition of $Si_xO_y$.

4. A semiconductor device on a semiconductor substrate including an SRAM cell with a resistor comprising:

a patterned and etched first polysilicon layer is formed on said semiconductor substrate, said first polysilicon layer having sidewalls with spacers adjacent to said sidewalls, a first undoped, semi-insulating SIPOS layer, comprising an interpolysilicon layer, formed over said spacers and said first polysilicon layer, said first SIPOS layer being patterned with an opening therethrough to a contact area on the surface of said first polysilicon layer, a second SIPOS layer overlying said first SIPOS layer, having a composition of $Si_xO_y$, said second SIPOS layer including two regions comprising as follows:

a) a first region of said second SIPOS layer comprising a conductor formed over said first SIPOS layer, said first region being spaced away from said contact area, and b) an undoped second region of said second SIPOS layer comprising a resistor formed over said first SIPOS layer said resistor extending through said opening into contact with said contact area on said first polysilicon layer, and said undoped second region of said second SIPOS layer comprising an undoped load resistor region formed over said contact area, said first region 1 of said second SIPOS layer comprising a doped interconnect structure integral with said load resistor region, but doped with dopant and therefore having a lower resistance than said second region of said second SIPOS layer, and dielectric layer formed over said second SIPOS layer.

5. The semiconductor device of claim 4 wherein said interpolysilicon layer has a thickness from about 300 Å to about 2,000 Å.

6. The semiconductor device of claim 4 wherein said second SIPOS layer has a thickness from about 300 Å to about 800 Å.

7. The semiconductor device of claim 4 wherein said dielectric layer formed over said second SIPOS layer has a thickness from about 5,000 Å to about 10,000 Å.

8. The semiconductor device of claim 4 wherein said first region of said second SIPOS layer comprises a doped interconnect structure integral with said load resistor region, doped with dopant selected from the group consisting of phosphorus and arsenic ions implanted with a concentration resulting from implanting said dopant from $1 \times 10^{14}$ ions/cm$^2$ to $9 \times 10^{15}$ ions/cm$^2$ at an energy from 20 keV to 40 keV.

9. A semiconductor device on a semiconductor substrate including an SRAM cell with a resistor comprising:

a patterned and etched first polysilicon layer on said semiconductor substrate, an undoped interpolysilicon layer consisting of a silicon dioxide layer formed over said first polysilicon layer, said undoped interpolysilicon layer patterned with an opening therethrough to a contact area on the surface of said first polysilicon layer, a SIPOS layer having a composition of silicon oxide, said SIPOS layer comprising two regions including as follows:

a doped interconnect region spaced away from said contact area, and an undoped load resistor region formed over said interpolysilicon layer extending into contact with said first polysilicon layer through said opening through said undoped interpolysilicon layer, said undoped load resistor region extending over said contact area, said doped interconnect region being integral with said undoped load resistor region and said interconnect region having been doped with dopant selected from the group of materials consisting of phosphorus and arsenic to lower the resistance of said doped interconnect region of said SIPOS layer, and said device including a dielectric layer formed over said SIPOS layer.

10. The semiconductor device of claim 9 wherein said SIPOS layer has a thickness from about 300 Å to about 800 Å.

11. The semiconductor device of claim 9 wherein said undoped interpolysilicon layer consists of silicon dioxide having a thickness from about 300 Å to about 2,000 Å formed over said first polysilicon layer.

12. The semiconductor device of claim 9 wherein said dielectric layer formed over said SIPOS layer has a thickness from about 5,000 Å to about 10,000 Å.

* * * * *